United States Patent
Platzgummer et al.

(10) Patent No.: US 8,304,749 B2
(45) Date of Patent: Nov. 6, 2012

(54) CHARGED-PARTICLE EXPOSURE APPARATUS WITH ELECTROSTATIC ZONE PLATE

(75) Inventors: Elmar Platzgummer, Vienna (AT); Stefan Cernusca, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 811 days.

(21) Appl. No.: 11/816,059

(22) PCT Filed: Feb. 9, 2006

(86) PCT No.: PCT/AT2006/000049
§ 371 (c)(1),
(2), (4) Date: May 5, 2008

(87) PCT Pub. No.: WO2006/084298
PCT Pub. Date: Aug. 17, 2006

(65) Prior Publication Data
US 2008/0230711 A1   Sep. 25, 2008

(30) Foreign Application Priority Data

Feb. 11, 2005 (AT) .................................. A 230/2005

(51) Int. Cl.
*G21K 5/10* (2006.01)
*H01J 37/08* (2006.01)
(52) U.S. Cl. ............. 250/492.22; 250/492.2; 250/492.3; 250/492.23; 250/492.21; 250/398
(58) Field of Classification Search ............. 250/492.22, 250/492.2, 492.3, 492.23, 492.21, 398
See application file for complete search history.

(56) References Cited

U.S. PATENT DOCUMENTS

| | | |
|---|---|---|
| 5,801,388 A | 9/1998 | Stengl et al. |
| 6,326,632 B1 | 12/2001 | Buschbeck et al. |
| 6,768,125 B2 | 7/2004 | Platzgummer et al. |
| 6,989,546 B2 * | 1/2006 | Loschner et al. ........ 250/492.22 |
| 2003/0155534 A1 | 8/2003 | Platzgummer et al. |
| 2003/0209676 A1 | 11/2003 | Loschner et al. |
| 2009/0026389 A1 * | 1/2009 | Platzgummer ............. 250/492.2 |

FOREIGN PATENT DOCUMENTS

| | | |
|---|---|---|
| EP | 1 139 384 A2 | 10/2001 |
| EP | 1 253 619 A2 | 10/2002 |

(Continued)

OTHER PUBLICATIONS

International Search Report for PCT International Application No. PCT/AT2006/000049 mailed Jun. 28, 2006.

(Continued)

*Primary Examiner* — Jack Berman
*Assistant Examiner* — Meenakshi Sahu
(74) *Attorney, Agent, or Firm* — RatnerPrestia

(57) ABSTRACT

In a particle-beam projection processing apparatus for irradiating a target by a beam of energetic electrically charged particles, including an illumination system, a pattern definition system for positioning an aperture arrangement composed of apertures transparent to the energetic particles in the path of the illuminating beam, and a projection system to project the beam onto a target, there is provided at least one plate electrode device, which has openings corresponding to the apertures of the pattern definition system and including a composite electrode composed of a number of partial electrodes being arranged non-overlapping and adjoining to each other, the total lateral dimensions of the composite electrode covering the aperture arrangement of the pattern definition system. The partial electrodes can be applied different electrostatic potentials.

20 Claims, 16 Drawing Sheets

FOREIGN PATENT DOCUMENTS

| | | |
|---|---|---|
| JP | EP 1139384 A2 * | 10/2001 |
| JP | 2002-319532 | 10/2002 |
| JP | 2004-165499 | 6/2004 |
| JP | 2008-218422 | 9/2008 |
| WO | 2004038509 A2 | 5/2004 |
| WO | WO 2005/024881 A2 | 3/2005 |

OTHER PUBLICATIONS

European Examination Report for European Appln. No. 06704691.2 dated Jul. 29, 2011.

Japanese Office Action for Application No. JP 2007-554380 mailed Nov. 22, 2011.

* cited by examiner

CHARGED-PARTICLE EXPOSURE APPARATUS WITH ELECTROSTATIC ZONE PLATE

CROSS-REFERENCE TO RELATED APPLICATIONS

This application is a U.S. National Stage application of PCT Application No. PCT AT06/000049, filed Feb. 9, 2006, which claims priority from Austrian Patent Application No. A 230/2005, filed on Feb. 11, 2005.

FIELD OF THE INVENTION AND DESCRIPTION OF PRIOR ART

The invention relates to improvements on particle-beam projection processing apparatus for irradiating a target by means of a beam of energetic electrically charged particles, comprising an illumination system, a pattern definition (PD) system and a projection system in order to project the beam patterned by the PD system onto a target positioned after the projection system. The illumination system serves to generate and form the energetic particles into a wide-area illuminating beam which is substantially tele/homocentric at the location of the PD system and sufficiently wide to illuminate the entire area reserved for apertures in the PD system simultaneously; the PD system, located after the illumination system as seen along the direction of the beam, positions an aperture arrangement composed of apertures transparent to the energetic particles in the path of the illuminating beam, thus forming a patterned beam emerging from the aperture arrangement; and, positioned after the PD system, the projection system projects the patterned beam as mentioned.

One important application of processing apparatus of this kind is in the field of particle-beam lithography used in semi-conductor technology, as a lithography apparatus, wherein, in order to define a desired pattern on a substrate surface, the wafer is covered with a layer of a radiation-sensitive photo-resist, a desired structure is imaged onto the photoresist by means of a lithography apparatus which is then patterned by partial removal according to the pattern defined by the previous exposure step and then used as a mask for further structuring processes such as etching. Another important application of processing apparatus of this kind is in the field of nano-scale patterning, by direct ion beam material modification or ion beam induced etching and/or deposition, used for the fabrication or functionalization of nano-scale devices, particularly having sub-100 nm feature sizes.

The IMS-concept PLM2 (short for "Projection Mask-Less Lithography") as described in the U.S. Pat. No. 6,768,125 realizes a multi-beam direct write concept uses a programmable aperture plate system (APS) for structuring an electron beam, which is extracted from a single electron source. At the APS the kinetic energy of the electrons is 5 keV. After the APS the electrons are accelerated to 100 keV and the image of the APS is reduced 200 times and projected onto the substrate.

A problem often encountered with electrooptical systems is the compensation of imaging aberrations and distortions. For example, in the case of aberrations of the illuminating beam, a situation may arise where the passage of a beamlet is blocked since the local direction of the beamlet is not in line with the arrangement of consecutive openings in the plate components of the PD device. A similar effect will be due if a misalignment of the plate components is present. Aberrations of the projection system will introduce distortions to the image of the aperture arrangement on the target.

As is well-known in prior art, electrostatic lenses formed by a combination of annular electrodes always are focusing lenses (positive refracting power) and, without exception, have significant aberrations of the third order which can only be slightly influenced by the shape of the electrode geometry. By using diverging lenses (negative refractive power) it is possible to achieve a compensation of the aberrations of the combined lens system by cancellation of the contributions to the third-order aberrations of the focusing and diverging lenses, and further making also possible to greatly reduce the other coefficients of aberrations. It is not possible, though, to achieve a lens of negative refractive power by means of annular electrodes alone; on the contrary, it is necessary to use a plate or control grid electrode through which the beam passes.

U.S. Pat. No. 5,801,388 and U.S. Pat. No. 6,326,632 of the applicant/assignee propose to use the mask of a lithography apparatus to form diverging lenses in combination with annular electrodes located in front and after the mask, respectively.

However, it is often desirable to have a diverging lens that is able to compensate for aberration errors of higher rank than third order and/or distortions, or to correct specific aberration coefficients, or to correct for misalignment in the PD apparatus. Furthermore, a combined correction for the illuminating beam (aberration errors of the illuminating system) and for the beam after the PD device (aberration errors of the projection system) is desirable.

SUMMARY OF THE INVENTION

It is one goal of the present invention to provide a particle-beam system using divergent lenses in order to reduce the various aberration effects present in the illumination and/or projections systems of the particle beam system. It is another goal of the present invention to provide a particle-beam system which is correctable/controllable with respect to radial and circular image distortions.

This goal is achieved by the provision of a plate electrode means having openings for the apertures of the pattern definition device and comprising a composite electrode composed of a number of partial electrodes which are arranged adjoining to each other according to a partitioning of the surface area of the plate electrode means into non-overlapping sub-areas, the partial electrodes being adapted to be applied different electrostatic potentials, as described in the claims, wherein the composite electrode as a whole has lateral dimensions covering the area reserved for the aperture arrangement in the pattern definition device. The composite electrode, in particular the partial electrodes, are preferably made of electrically conductive material such as metal. However, any material can be chosen which gives rise to a well-defined electrostatic boundary if placed in an electrostatic environment with presence of electrostatic fields. One alternative to electrically conductive material could be a semiconducting material with sufficient doping.

There may be one or more plate electrode means present in the particle-beam projection processing apparatus or, preferably, the pattern definition system.

This plate electrode means realizes an electrostatic zone plate (EZP), which provides a simple and yet efficient means to implement a diverging lens and/or specific compensation for the imaging problems discussed above. It should be appreciated that it is also because of the fact that an EZP covers a very large fraction of the cross section, whereas the beam only traverses openings (corresponding to the apertures of the PD device) which, in total, make up only a small fraction of the cross section.

In one advantageous realization of the invention, the plate electrode means may be positioned in an electrode arrangement having at least one additional electrode which is positioned out of plane of the composite electrode, as seen along the optical axis, and preferably in proximity to the plate electrode means. The additional electrode may comprise at least one multipole electrode which, likewise, is positioned out of plane of the composite electrode.

Preferably, the partial electrodes are positioned along a two-dimensional plane oriented orthogonal to the optical axis.

In a preferred embodiment of the invention, the plate electrode means may be positioned immediately in front of or after the remaining components of the pattern definition device, as seen along the direction of the beam. This facilitates the correction of aberrations specifically for the PD apparatus whose aperture field represents the object to be imaged onto the substrate.

In one useful application of the invention relating to a particle-beam apparatus having a projection system which comprises at least two consecutive projector stages, namely at least one non-final projector stage and one final projector stage, a plate electrode means may be located at or close to the location of an intermediate image of the aperture pattern as formed by a non-final stage of the projection system. The plate electrode means is preferably located at the position of the intermediate image, but can be shifted to a position only close to it as long as the individual beamlets (respectively corresponding to the apertures) are discerned at the location of the plate electrode means.

Various arrangements of the partial electrodes are possible and useful depending on the specific function. For instance, they may be shaped as concentric rings, or as sectors arranged around an optical axis of the plate electrode means. The sector-shaped partial electrodes may be arranged around a central area of the plate electrode means, and this central area forms at least one further partial electrode.

The plate electrode means may further comprise a common electrode arranged in parallel beneath the partial electrodes, the common electrode being separated from the partial electrodes by an insulating spacer layer. One function of this common electrode can be to provide a well-defined potential on the opposite side of the plate electrode means.

In order to reduce the effect of stray electric fields between the partial electrodes, an insulating, dielectric material may be provided in the gap between neighboring partial electrodes to separate different potentials of neighboring partial electrodes and to produce a dielectric polarization that reduces the total stray field at the position of the neighboring apertures. Alternative, a resistive material may be provided in the gap between neighboring partial electrodes to form a potential divider chain of different partial electrode potentials.

One simple way to rule out effects of the stray fields occurring at the edges of the partial electrodes upon the beamlets at those places is that the openings corresponding to the apertures of the pattern definition system are present only within the areas of each of the partial electrodes, whereas no such openings are present at the edge of the partial electrodes or in the gaps between them.

As already mentioned, the invention offers a versatile means for correction of various imaging problems. In one specific application, the plate electrode means according to the invention may be used, for example, at a position after the pattern definition device (or as its last element) to correct for image distortions by forming an electrostatic lens in combination with an annular electrostatic lens element of the projection system, in order to shift the virtual image by deflection in an out-of-focus plane.

Another application of a plate electrode means according to the invention envisions to be positioned in place of or after the location of an intermediate image formed in the projection system, to correct for image distortions by locally shifting the virtual image of the intermediate image by deflection in an out-of-focus plane.

For one further application of many, the plate electrode according to the invention may be adapted to be positioned in place of or after the location of an intermediate image formed in the projection system, to produce a negative focal length at the position or near the intermediate image by forming an electrostatic lens in combination with an annular electrostatic lens element of the projection system on either or both sides of the plate electrode means.

BRIEF DESCRIPTION OF THE DRAWINGS

In the following, the present invention is described in more detail with reference to the drawings:

FIG. 12b shows the optimized potentials of the electrodes of FIG. 12a;

DESCRIPTION OF EMBODIMENTS OF THE INVENTION

The present invention arranges for providing a particle-beam system using divergent lenses formed by tube electrodes (ring electrodes, annular electrodes) and a composite plate electrode. The composite plate electrode is, for instance, realized as a planar electrostatic zone plate (EZP) having a multitude of multi-zone electrodes. The EZP comprises holes for the passage of the particle beam through the apertures of the PD device and is arranged in the beam path, perpendicular to the optical axis. The system of tube electrodes and EZP can be integrated to the illuminating system and/or to the projection system. (Correspondingly, the EZP is immediately in front of or after the PD device, respectively.) It is important to note that in the framework of this disclosure, the term tube electrodes also includes multipole electrodes, for example octupoles, which have tubular or annular shape as a whole. In an advanced embodiment of the invention, the EZP can be integrated additionally at the position of or in the neighborhood of an intermediate image of the projection system. By applying different electrostatic potentials to the tube electrodes and to the EZP, the EZP and the tube electrodes form an electrostatic lens of the grid-lens type with negative and/or positive refracting power, which can be radially controlled. The refracting power of the grid lens can be controlled by the different potential of the zone electrodes of the EZP and consequently, the above mentioned non-uniformity of the illuminating system and imaging aberrations (high-order angular distortion of the beams) of the projection system can be compensated. It is also possible to optimize the telecentricity of the beams at the wafer (in particular, the so-called landing angle of the particle at the wafer can be reduced). In a further embodiment of this type of design according of present invention, the cross-over point of the beam ("cross-over") can be homogenized by changing the potential to the tube electrode and the zone electrodes and the so-called stochastic space charge effects are minimized. Using several EZP devices in one system, for example on both sides of the PD (oriented towards the illumination system and projection system), several correction effects can be superposed simultaneously.

The preferred embodiment of the invention discussed in the following is based on the PML2-type particle-beam exposure apparatus with a pattern definition (PD) system as disclosed in the U.S. Pat. No. 6,768,125 (=GB 2 389 454 A) of the applicant (assignee), the disclosure of which with regard to the PML2 system and, in particular, the PD device used therein is enclosed herewith as part of this disclosure.

Figure 1:
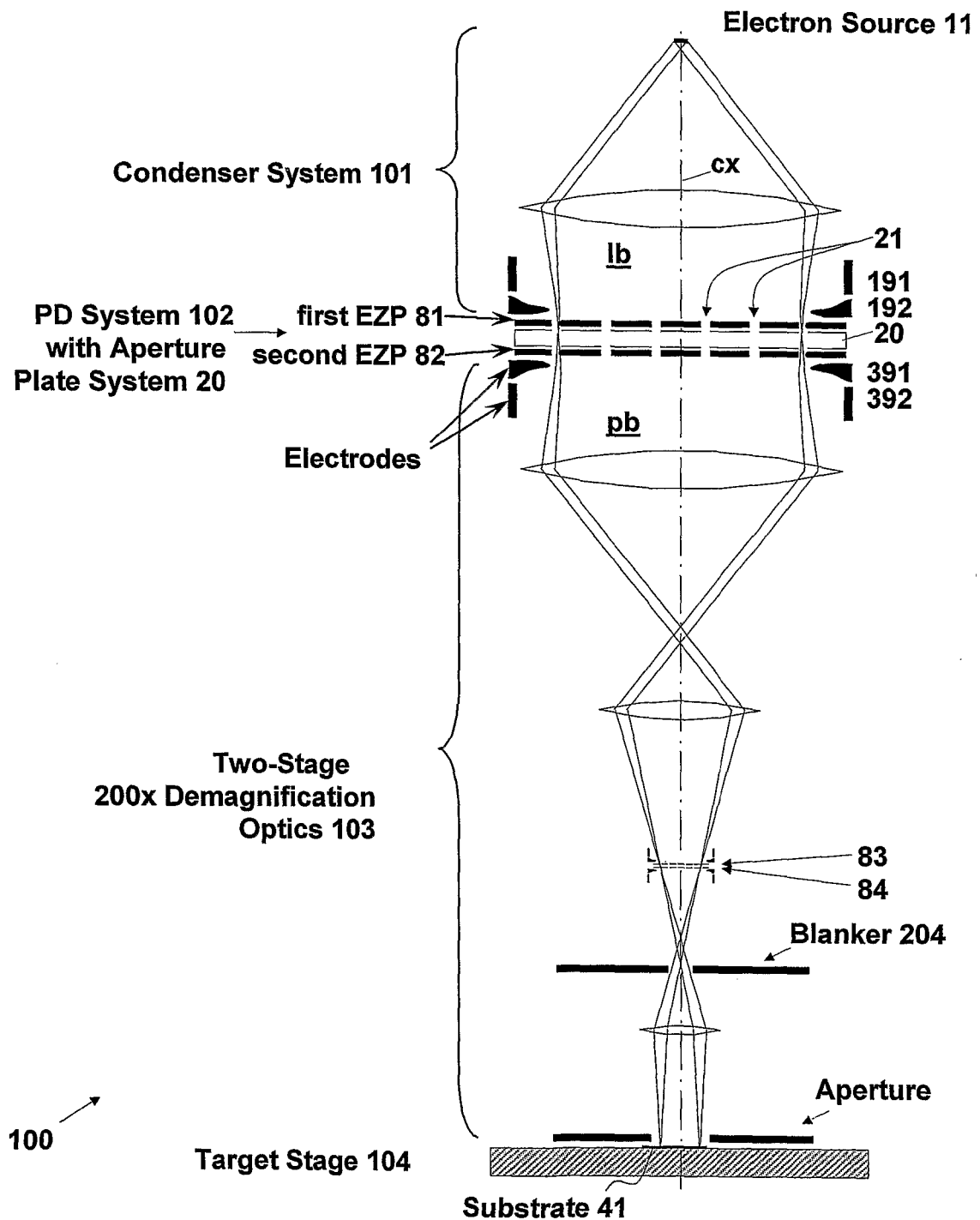
FIG. 1 is a schematic longitudinal section of a lithography apparatus in which the invention is realized.

Referring to the longitudinal section of FIG. 1 (the lateral dimension are not to scale), the main components of the PML2 apparatus 100 are—corresponding to the direction of the lithography beam lb, pb which in this example runs vertically downward in FIG. 1—an illumination system 101, a PD system 102, a projecting system 103, and a target station 104 with the target which is, for instance, a semiconductor substrate 41. The particle-optical systems 101, 103 are realized using electrostatic and/or electromagnetic lenses. The electrooptical parts 101,102,103 of the apparatus 100 are contained in a vacuum housing (not shown) held at high vacuum to ensure an unimpeded propagation of the beam lb, pb along the optical axis cx of the apparatus.

The lithography apparatus 100 has two plate electrode means 81,82 according to the invention. A first EZP 81 is oriented toward the illuminating system 101, allowing of forming a first divergent lens in front of the PD system 102, namely in combination with the last two tube electrodes 191, 192 of the illuminating system 101. A second EZP 82 is oriented toward the projecting system 103, allowing of forming a second divergent lens after the PD system 102, namely in combination with the first tube electrodes 391,392 of the projection system 103. It is worthwhile to note that the actual shape of the tube electrodes 191,192,391,392 may have more complicated shapes than shown here in the figures (mostly, only simple rectangular shapes are depicted here for the sake of clarity), depending on the layout of the optical system. The other electrodes of the illumination and projector systems 101,103 are not shown; instead they are symbolized by lens symbols.

The PD system 102 comprises a PD device with the arrangement 21 of apertures that are to be imaged onto the substrate 41, and the devices (not shown) to position and electrically control the PD device. The PD device is realized as an aperture plate system (APS) 20 composed of a number of plates stacked together as described in detail in the U.S. Pat. No. 6,768,125. In the embodiment shown, the EZPs 81,82 are integrated with the first and last plates of the APS, respectively; in a variant, they could be realized as separate elements in front of/after the plates of the APS.

The width of the illuminating beam lb must be sufficient so simultaneous illumination of the aperture arrangement 21 is possible. Preferably, its diameter is greater by at least one order of magnitude than the length of the tele/homocentricity region of the illuminating beam, which shall mean that the beam divergence is small enough so that all sub-beams formed by one plate of the stack of plates of the PD pass the last plate of the stack without significant loss of intensity.

Figure 2:
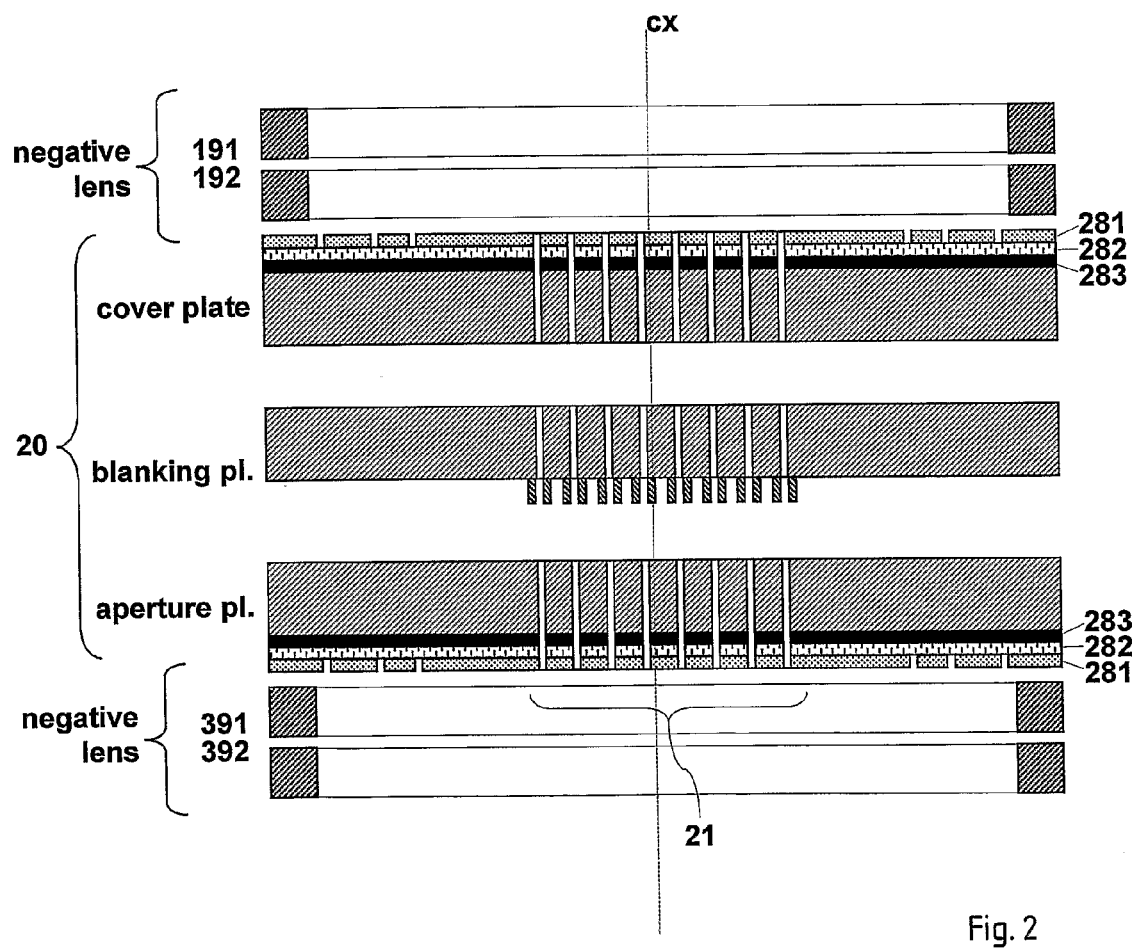
FIG. 2 displays the schematic setup of the PD device.

FIG. 2 shows the schematic setup of the PD device; the lateral dimension are not to scale. The PD device 20 comprises stacked plates, mounted such that the openings align. The first EZP is realized on top of the first plate of the PD device (cover plate) as a segmented (partitioned) electrode layer 281, formed on an insulating layer 282 which serves to insulate the layer 281 from the plate, like a conducting layer 283. Likewise, the second EZP is realized on the bottom of the last plate of the PD device, the aperture plate. Certainly, the aperture plate (=beam forming plate, comprising the smallest apertures along a sub-beam path) can be combined with either the cover plate or the blanking plate, which would mean that the EZP as drawn in FIG. 2 is realized as an additional plate to the PD device. The middle plate of the PD-device is used for the blanking of the multi beams (called "blanking plate"), whereas the stopping of the beams deflected by the blanking plate is realized by a common stopping plate positioned further downstream the beam path at a lower part of the PLM2 apparatus (for example the blanker diaphragm 204 in FIG. 1).

Also the last two electrodes of the illuminating system 191,192 are depicted which can be used to form a lens of negative diffracting power (divergent lens) together with the first EZP. Likewise, the first two electrodes 391,392 of the projecting system can be used for a divergent lens together with the second EZP. At least one electrode (in addition to the EZP) is required in order to fully exploit the possibility to adjust either a positive or negative focal length.

Figure 3A:
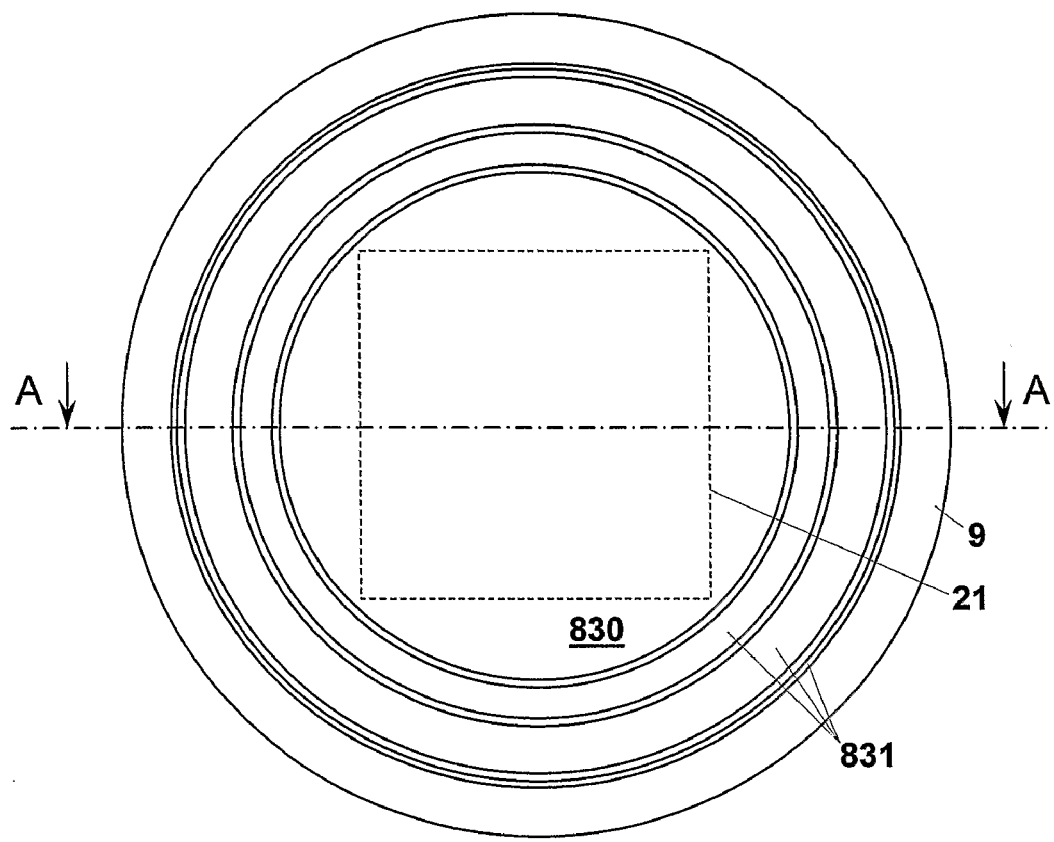
FIGS. 3a and 3b show a plan view and longitudinal sectional view, respectively, of a first version of a multi-zone electrode.
Figure 3B:
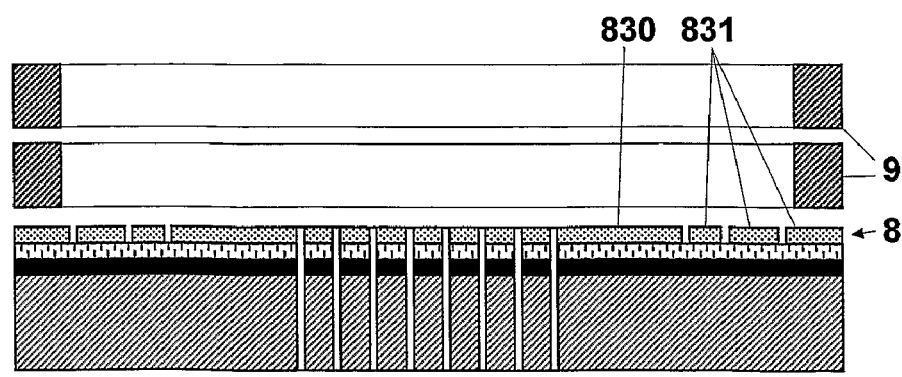

The plan view of FIG. 3a and the longitudinal sectional view of FIG. 3b (section along line A-A of FIG. 3a) show a first version of a multi-zone electrode according to the invention, for the example of the first EZP on the cover plate. A planar (basically two-dimensional) composite electrode 8 is composed of circular (or annular) electrostatic partial electrodes 831 surrounding an electrostatic central partial electrode 830. The central electrode 830 covers the area of the aperture arrangement 21 (aperture field) of the PD device, whereas the composite electrode 8 as a whole extends beyond the range of the aperture field and the radius of the neighboring tube electrodes 9.

Figure 4A:
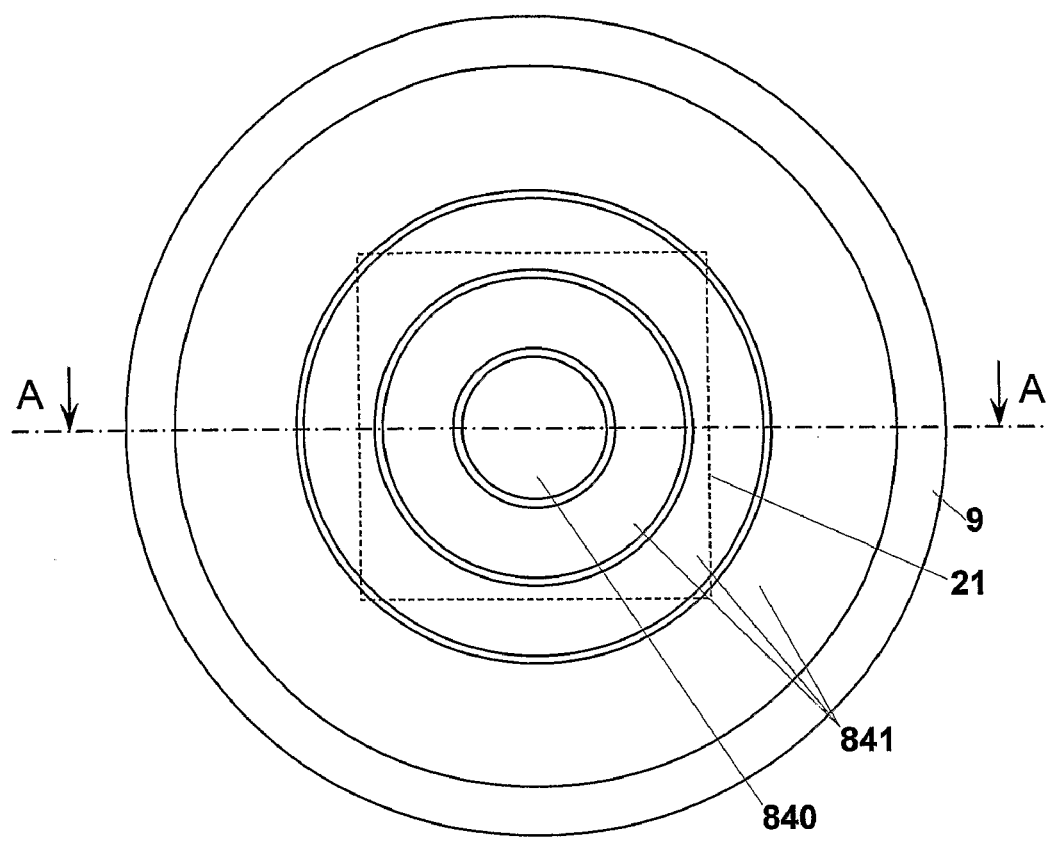
FIGS. 4a and 4b show a plan view and longitudinal sectional view, respectively, of a second version of a multi-zone electrode.
Figure 4B:
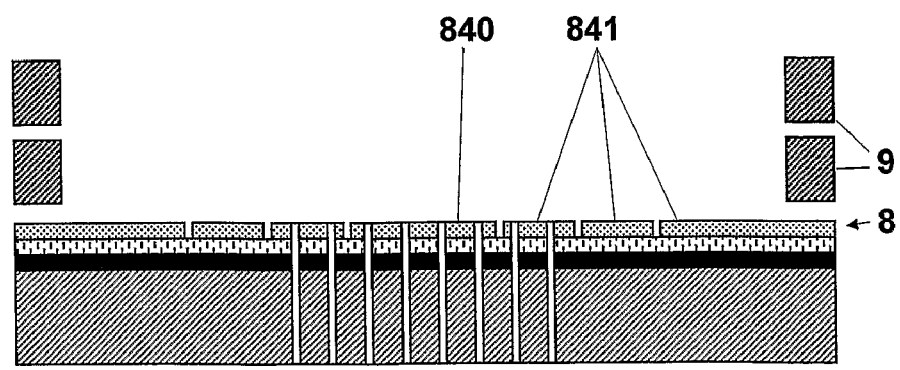

A second version of a multi-zone electrode is shown in FIG. 4a and FIG. 4b. Here, the area of the aperture arrangement is covered by the central partial electrode 840 and the innermost of the circular partial electrodes 841. By choosing small gap distances between the composite electrodes in the neighborhood of apertures inside the aperture arrangement, the influence of stray fields on the respective sub-beams can be kept sufficiently small.

Figure 5A:
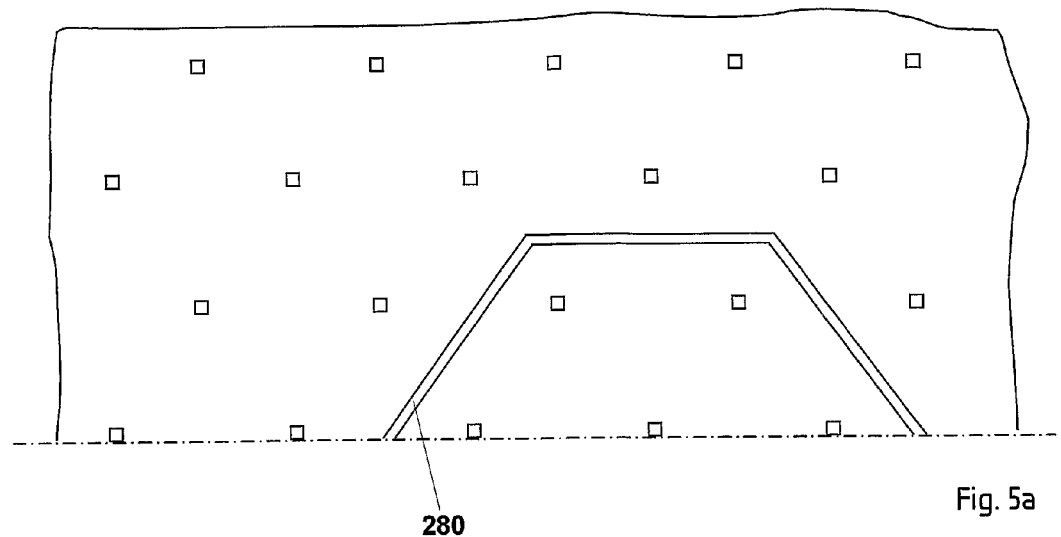
FIGS. 5a and 5b show an enlarged plan view and longitudinal sectional view detail, respectively, of the EZP setup at a gap between two partial electrodes.
Figure 5B:
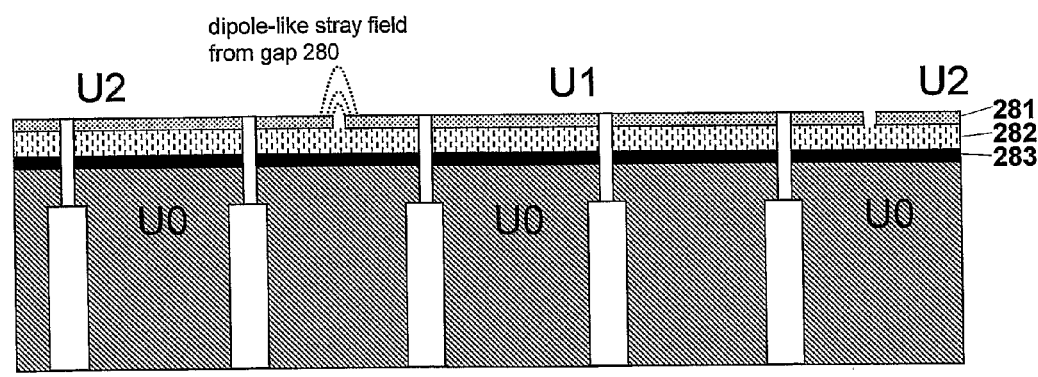

FIGS. 5a and 5b show a detail of the EZP setup. Between the equidistant apertures (FIG. 5a), there is a gap 280 of a width of 1 μm, for instance, between the zones covered by the different partial electrodes. A 50 μm silicon plate is covered with three 1 μm thick layers 281,282,283 (FIG. 5b). A conductive layer 283 shields the electrical field of the multi-zone plate from the region below the plate, denoted by the electrostatic potential U0. The second layer 282 is an insulator. The thickness of the insulator layer 282 is suitably chosen sufficient so also the supplying lines for applying electrostatic potentials to the partial electrodes of the layer 281 can be accommodated. The layer 281 realizes the different electrostatic partial electrodes, to which different electrostatic potentials U1, U2 can be applied. The diameters of the openings in line with the apertures are chosen such that the maximum local electrostatic field strength is minimized, and the focusing effect of the layers 281 and 283 is small enough [so that the numerical aperture NA of typically 10-50 μrad is not significantly increased (at, e.g., a focal length larger than 1 m). For this, the insulating layer may be withdrawn to form a retrograde shape of the opening, and the distance between 281 and 283 can be increased to several times the width of the aperture if suitable. For 5 keV electrons and a potential difference of a few Volts no such measures are required. The potential between the zone electrodes (U1, U2) and the silicon plate U0 is in the range of a few Volts. The electrical stray field between these zone sectors is a dipole filed, which is proportional to $1/r^3$ (r denotes the distance to the gap). To minimize the influence of this stray field to the beams passing through the apertures, a large distance between the apertures and the gap should be provided while the width of the gap 280 should be made small. The electrostatic field produced by the EZP, which is basically in axial direction, can be controlled/adjusted along the cross section of the optical axis. Therefore, the flight direction of the particles can be radially influenced by de- or acceleration (radial angle correction, radial focusing of the beam).

Figure 5C:
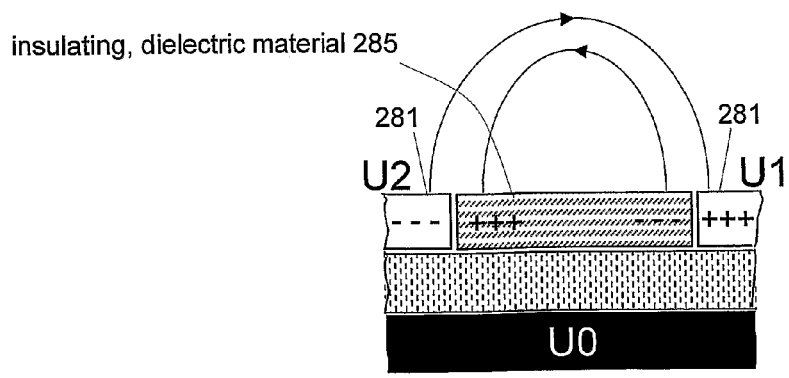
FIG. 5c is a further enlarged detail of the gap shown in FIG. 5b.

In a preferable variant illustrated by the FIG. 5c, a longitudinal section detail of the gap 280, the insulation between the composite electrode segments in the plane 281 of the electrodes is made from a dielectric material 285. By this measure, the related in-plane electric polarization due to a potential difference reduces the effective electrostatic field of the adjoining composite electrode segments for neighboring beam paths, thus achieving a reduction of the stray field. The two contributions to the electric fields are shown, namely (i) from the electrodes and (ii) from the induced polarization in the dielectric 285, which will mutually cancel to a great extent.

Figure 6A:
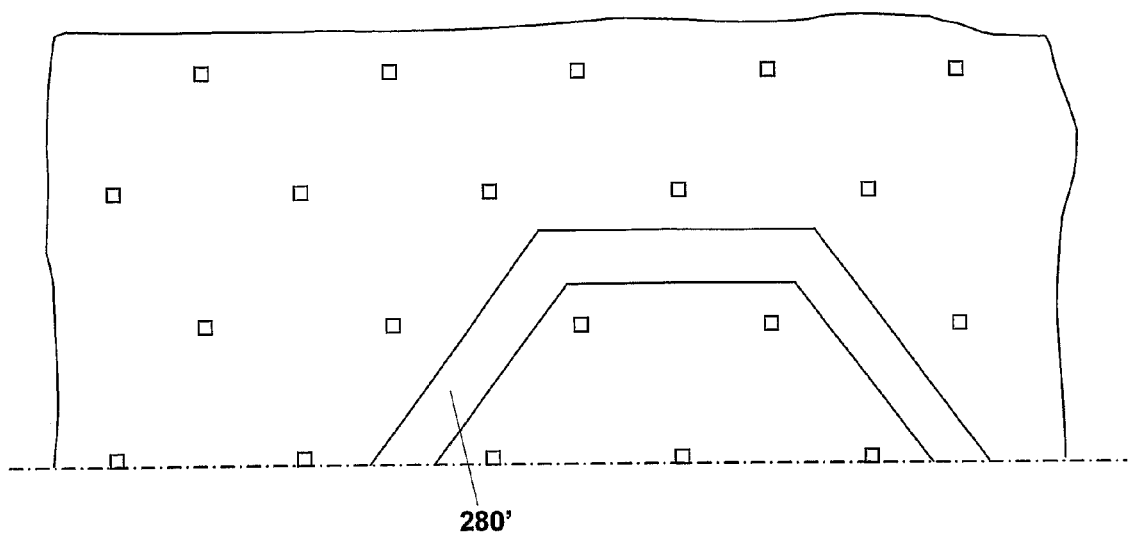
FIGS. 6a and 6b show a plan view and longitudinal sectional view detail, respectively, with a reduced stray field between the zone electrodes.
Figure 6B:
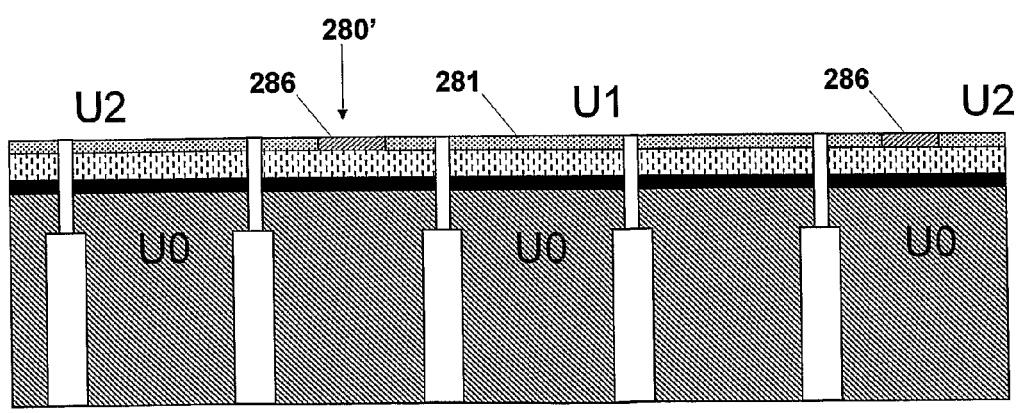

FIGS. 6a and 6b show a variant detail with a reduced stray field between the zone electrodes. The gap 280' between the electrodes is broadened to 10 μm and filled with a resistant material 286. The potential between the zone electrodes varies linearly for homogenous resistance. Obviously, a continuous resistance (e.g. by doping) can be used to affect any nonlinear variation of the potential between the conductive areas.

Figure 7:
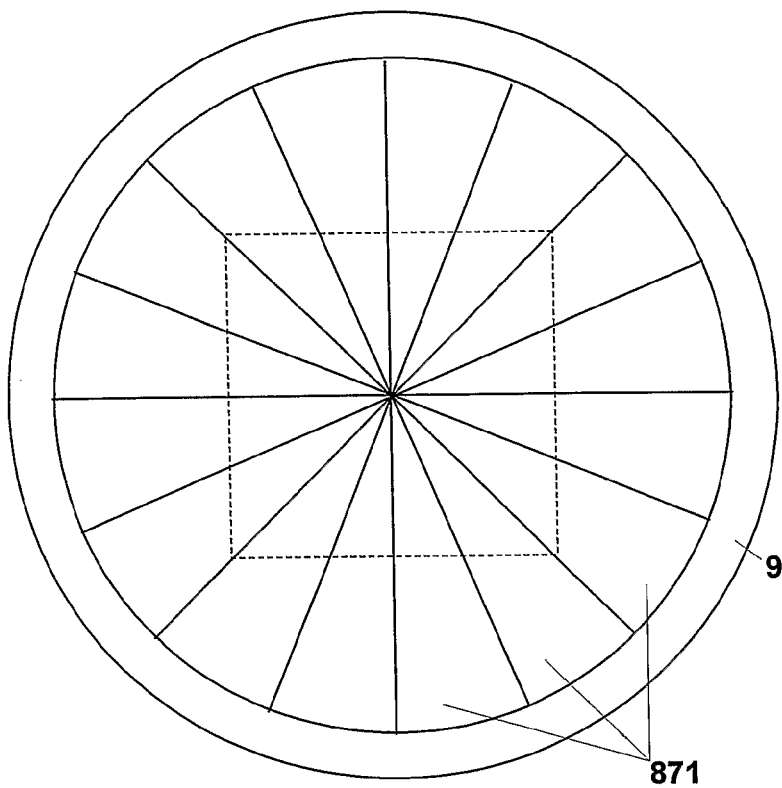
FIG. 7 shows a variant of a multi-zone electrode with sectorized electrodes.

The plan view of FIG. 7 shows another variant of a multi-zone electrode. In this case, the area of the composite electrode is sectorized into sector electrodes 871 extending beyond the aperture field. The centre of the aperture field 21 is preferably without aperture. This can be realized by dividing the aperture field in e.g. two or four aperture strips. The electrostatic field is changing normal to the radius vector and therefore the flight direction of the particle normal to the radius direction can be influenced (tangential angle correction, tangential beam focusing).

Figure 23:
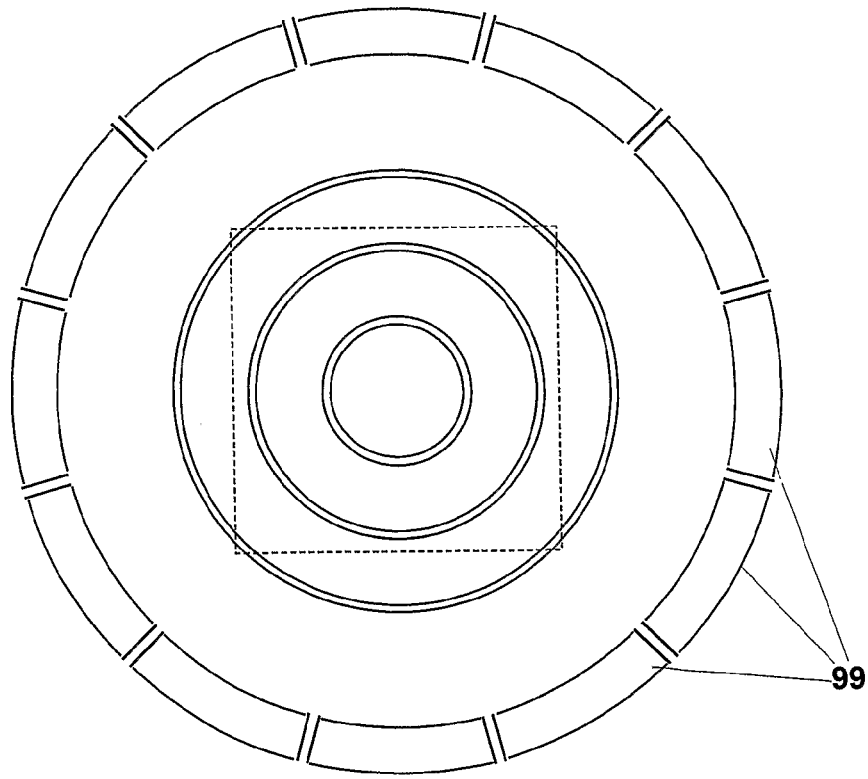
FIG. 23 shows a plan view of an EZP combined with a multipole tube electrode.

In this context, it is worthwhile to note with reference to FIG. 23 that the ring electrode of a neighboring tube electrode may also comprise a set of sector electrodes 99, thus realizing a multipole electrode 99. Such a multipole electrode 99 may be combined with any suitable geometry of multi-zone electrodes in place of the concentric arrangement shown in FIG. 7b.

Figure 8:
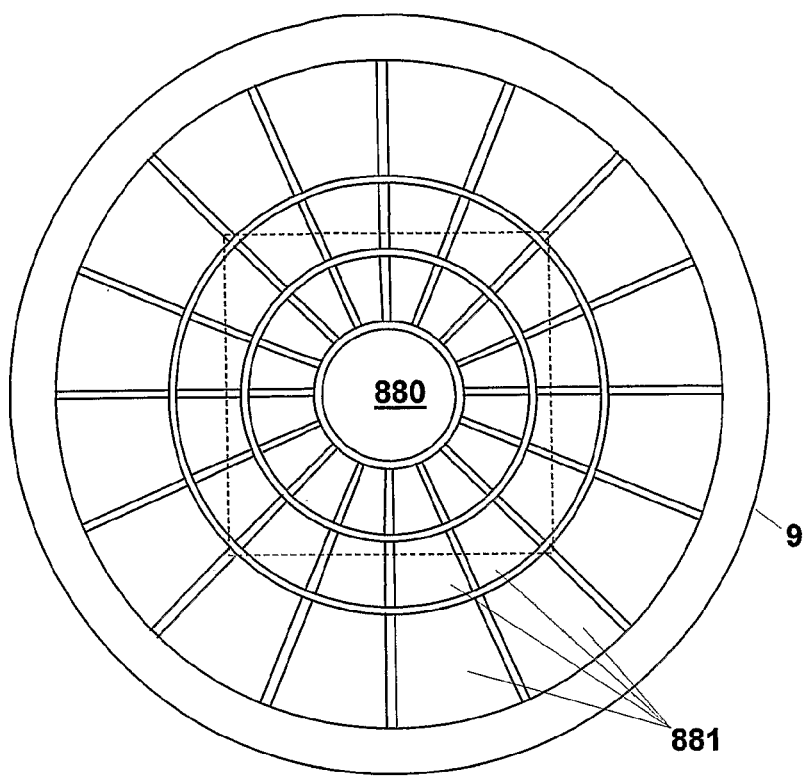
FIG. 8 shows a further variant with a combination of ring-shaped and sectorized partial electrodes.

The plan view of FIG. 8 shows yet another multi-zone electrode variant with a combination of ring-shaped and sectorized partial electrodes. In this case, the electrodes 881 are sectors of circular electrode rings. In the centre of the aperture field is only one circular electrode 880. The electrostatic field is changing normal and parallel to the radius vector and therefore the flight direction of the particle normal and parallel to the radius direction can be influenced (tangential/radial angle correction, tangential/radial beam focusing).

Figure 9:
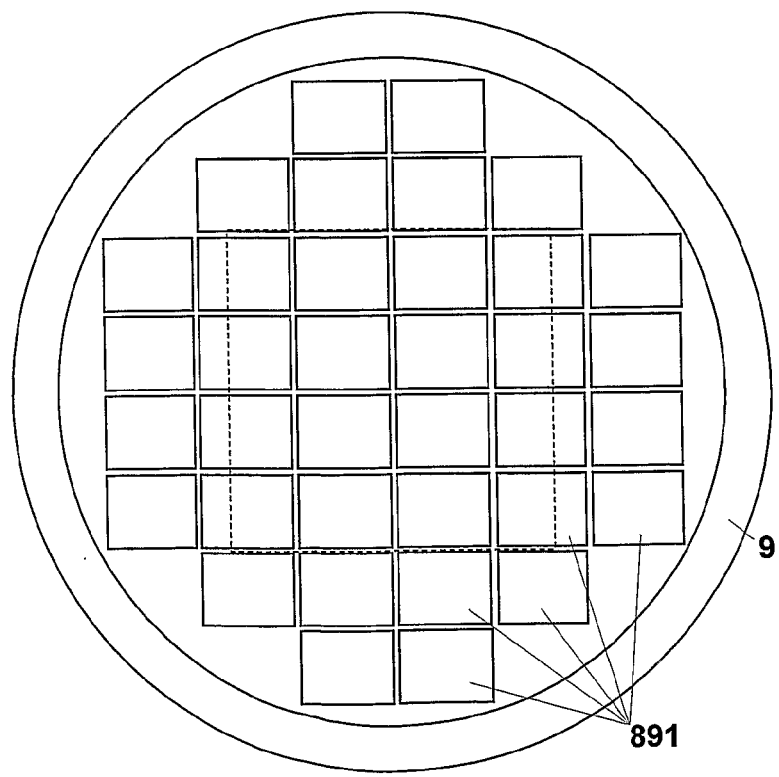
FIG. 9 displays a mosaic-shaped assemblage of partial electrodes.

Also a mosaic-shaped assemblage of partial electrodes is possible; one example is shown in FIG. 9. The rectangular partial electrodes 891 cover the area within and preferably also beyond the aperture field. The electrical field can be controlled in xy-direction. The image aberration without radial component can be corrected. In this case, the composite electrode is within the radius of the annular electrodes 9.

Figure 10:
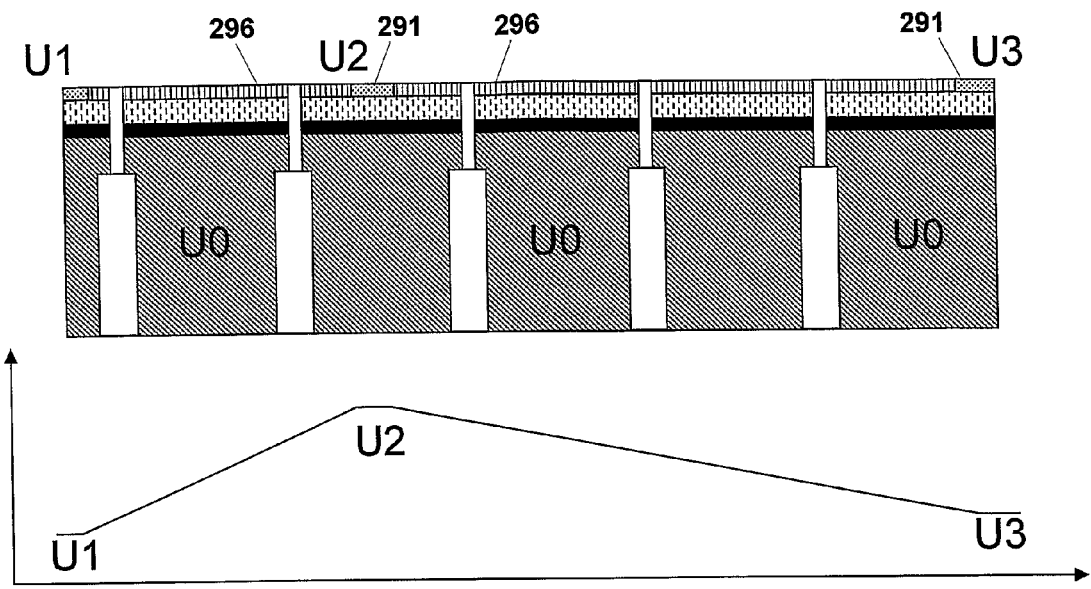
FIG. 10 shows a realization of the partial electrodes with spatially varying potentials.

FIG. 10 shows one further realization of the partial electrodes. The electrodes are realized as metallic areas of the electrode layer 281, of a metallic substance 291, electrically connected by a resistive material 296. The electrodes are made with standard semi conducting methods. The membrane and aperture openings are etched into a wafer with two insulated conducting layers. Then the electrode borders are lithographically copied to the wafer. After this process the gap between the zone electrodes is etched. The electrodes can be directly contacted and between of the electrodes a resist mesh (using the potentiometer effect) can be used. Also shown is the spatial variation of the electrostatic potential along the lateral direction of the section shown.

Figure 11:
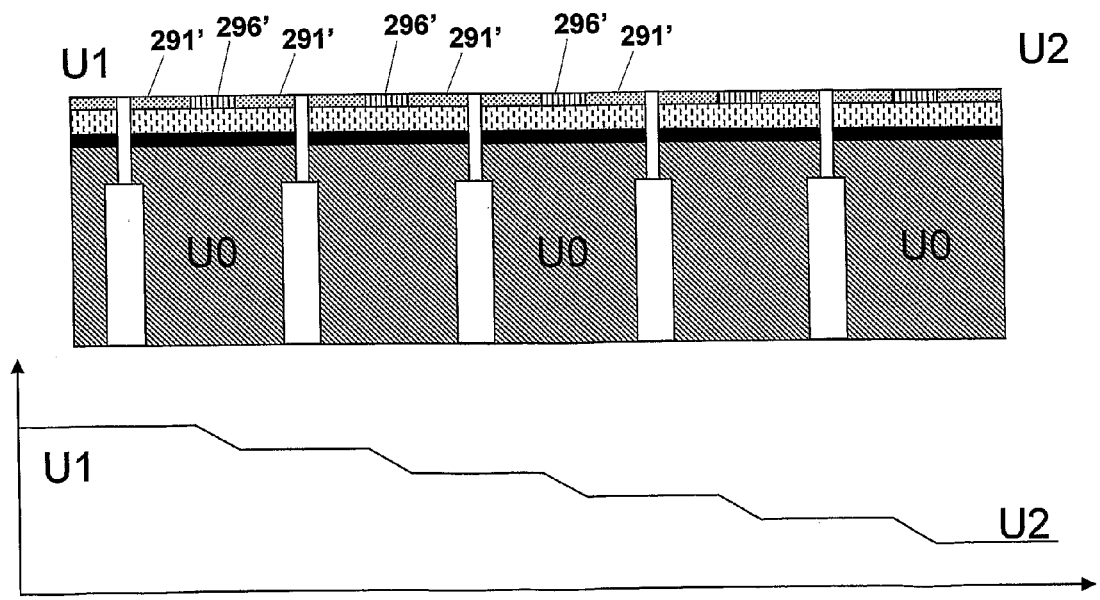
FIG. 11 shows another realization providing spatially varying potentials.

FIG. 11 shows yet another realization of the electrodes, where around each aperture, a range of metallic material 291' is present, while a resistive material 296' provides for a continuous behavior of the potential as depicted. Thus, the resistive material 296' forms a potential divider chain which defines the individual electrostatic potentials of the different partial electrodes. The electrodes can be directly contacted and potential between this electrodes can be controlled by doping this area between the electrodes.

Figure 12A:
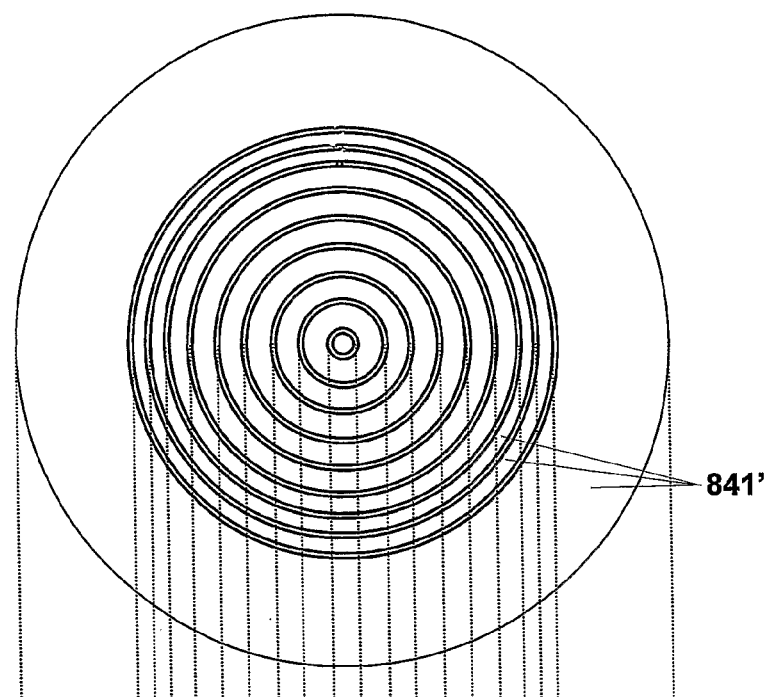
FIG. 12a shows an EZP whose potentials are optimized for a minimum blur.
Figure 12B:
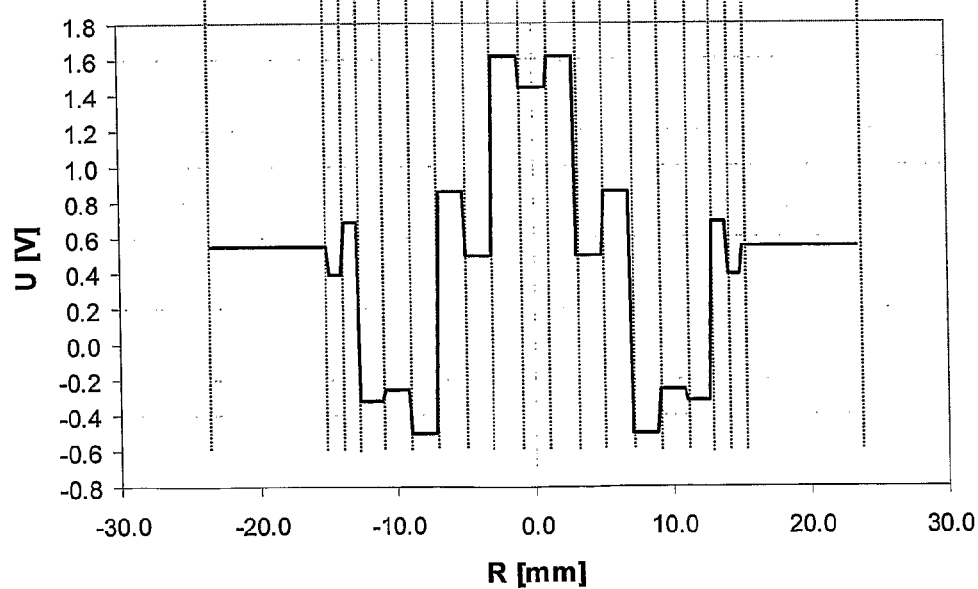

FIGS. 12a and 12b show an example of an EZP (upper image) with potentials optimized for a minimum blur of the imaging system with a 20 mm×20 mm aperture arrangement. FIG. 12a shows an EZP with ten different broad circular electrostatic zone electrodes 841' (cf. FIG. 4a; annular electrode 9 not shown here). FIG. 12b shows the optimized potentials of the electrodes. The regions with positive voltage are forming a lens of positive diffracting power and the regions with negative voltage a lens of negative diffracting power (divergent lens). This optimized EZP achieves an improved beam emittance (FIG. 15), curvature of the image plane (FIG. 16) and beam blur, whereas the blur is reduced by 50% compared to the case without the EZP. If optimized for telecentricity on the wafer (=correlates with the depth of focus; not shown), the resulting telecentricity is reduced by more than a factor of 10 using only one EZP oriented towards the projection system.

Figure 13:
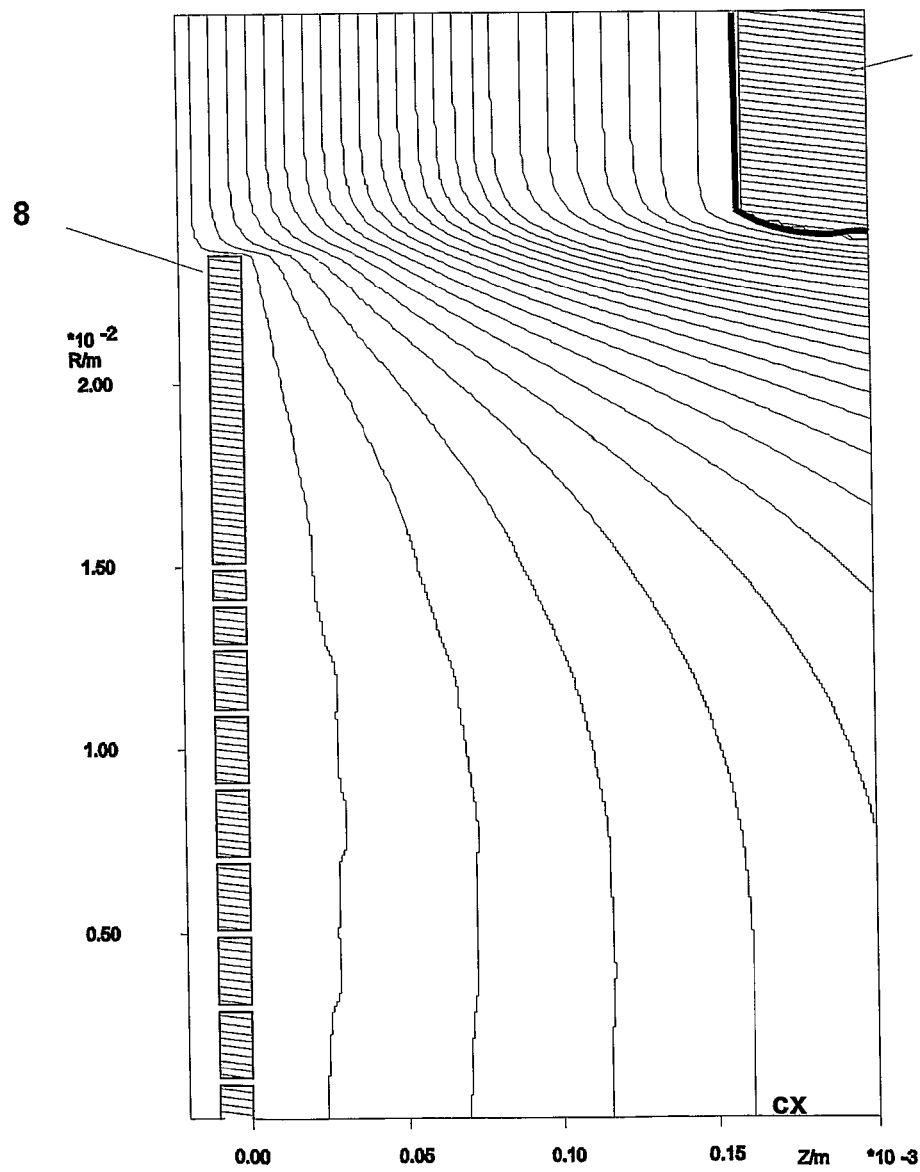
FIG. 13 displays the equipotential lines of the arrangement of FIGS. 12a and 12b in a longitudinal sectional view.

FIG. 13 is a display of the equipotential lines of the arrangement of FIGS. 12a and 12b in a longitudinal sectional view. The optical axis is at the bottom of the graphic, the EZP at the left side and the tube electrode is shown in the right upper corner. The electrostatic field, and also the force onto the particle, is normal to the equipotentials.

Figure 14:
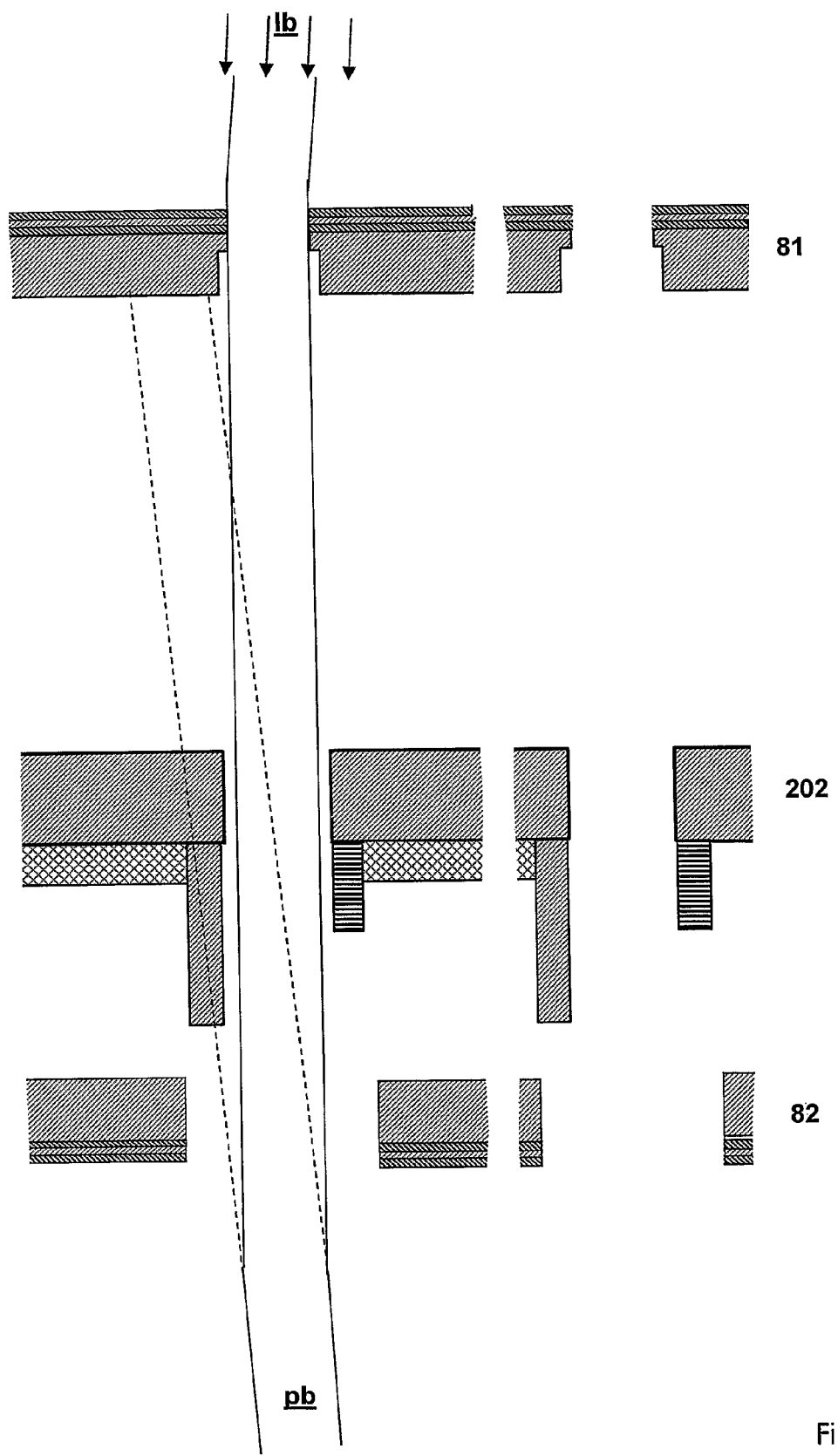
FIG. 14 is a longitudinal sectional detail of the PD device along two apertures.

FIG. 14 is a longitudinal sectional detail of the PD-device along two apertures (cf. FIG. 6 of U.S. Pat. No. 6,768,125). The first EZP 81 controls the telecentricity of the beams at the APS by correcting the local angle of incidence of the illuminating beam Ib. The aperture of this EZP defines the diameter of one single multi-beam and is projected onto the substrate (this is the object of the projection system). The middle plate 202 is the blanking plate used to switch on and off the individual beams respectively. The second EZP 82 can be used to realize a virtual distortion of the aperture of the first EZP 81; the dotted lines denote the virtual path of the beam bp, and instead of the actual apertures (original object) a virtual object is imaged to the target. Therefore it is possible to adjust the space distortion on the wafer.

Figure 15:
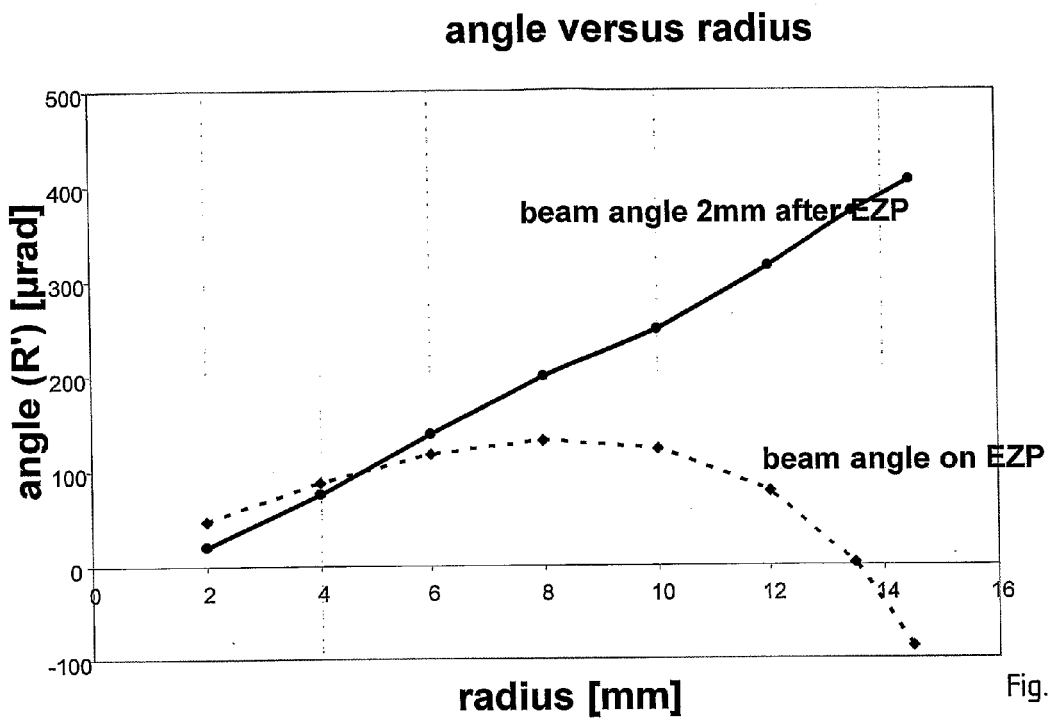
FIG. 15 shows the beam emittance of the optical system as improved by the invention.

FIG. 15 shows the beam emittance of the optical system, namely, the functional dependence of the beam angle upon the distance of the beam to the optical axis according to calculations performed by the applicant/assignee. The dotted line is the beam emittance at the position of the original PD device. The curvature of the line results from the aberration errors of the illumination system. By using an EZP it is possible to correct the beam emittance of the illumination system to a nearly perfect point source (a straight line).

Figure 16:
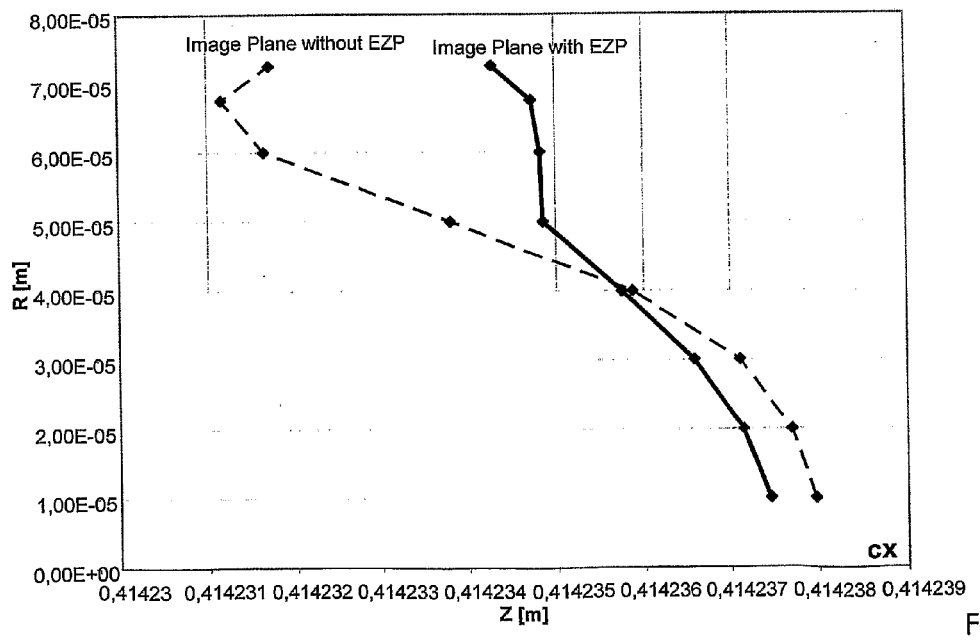
FIG. 16 shows the image plane at the wafer without using an EZP (dotted line) and with an optimized EZP (full line)

FIG. 16 shows the image plane at the wafer without using an EZP (dotted line) and with an EZP optimized accordingly (full line) according to calculations performed by the applicant/assignee. The bottom axis represents the optical axis cx. As can bee seen, the EZP reduces the curvature of the image plane and therefore the beam blur is minimized.

The EZP according to the invention may, for example, be used to correct for image distortions. For this task, it may be positioned after the pattern definition device (or as its last element) to form an electrostatic lens in combination with annular electrostatic lens elements of the projection system, in order to shift the virtual image by deflection in an out-of-focus plane. If a pre-distorted aperture plate (here, pre-distorted means that the distortion of the demagnified image is compensated by introducing a "negative" distortion in the objective plane, so that the real image is undistorted with respect to an ideal demagnified image) is used, the EZP according to the invention may be used to compensate for remaining errors in the image distortion, that may occur for example due to inhomogeneities in the magnetic properties of magnetic lenses, or due to space charge effects.

In general, almost any shape of the electrodes on the EZP is possible. In order to compensate for typical image distortions (handkerchief type), as for example spiral distortions on the boundary of the image field in case of magnetic lens dublets, the shape of the electrodes in the EZP can be optimized with respect to the expected errors. For this; the direction of the gradient (within the surface of the EZP, oriented towards increasing potential) of the electrode potential of the EZP may be chosen to be in opposite direction of the distortion vector (i.e., the difference vector between the actual position [distorted] and the ideal position [nominal], taken for each image point). To achieve this, either array-like segments as shown in FIG. 9 or shape-optimized electrodes with suitable potentials and gap densities (like in a contour plot) can be used.

As already mentioned, an EZP according to the invention is not only suitable in combination with a PD device, but also at other locations within a lithography apparatus. For instance, as shown in FIG. 1, one or more EZPs 83, 84 or a combination of one or more EZP with other lens elements may be positioned at or close to the position of an intermediate image. This allows for correction of aberration errors without interfering with the delicate structures of the PD system 102.

The design and construction of an EZP of the type as shown in FIG. 4a is discussed in more detail in the following referring to FIGS. 17 to 21.

Figure 17:
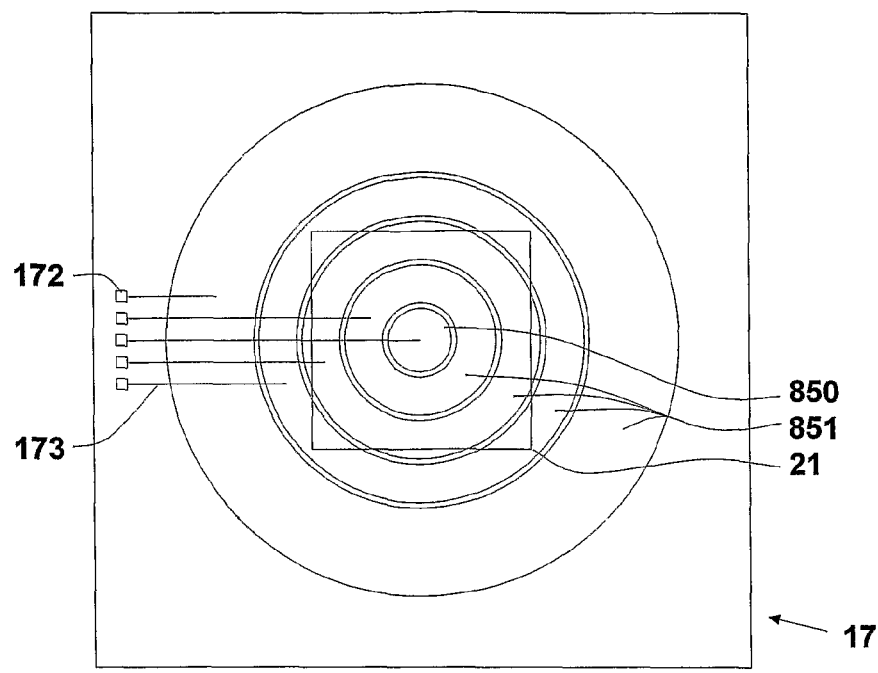
FIG. 17 is a plan view of an EZP device with circular electrode arrangement.

FIG. 17 shows a plan view of an EZP device 17 with circular electrode arrangement, produced on a SOI wafer. The area of the EZP proper is composed of a central partial electrode 170 and a number of circular (or annular) partial electrodes 171 (which correspond to electrodes 840, 841 of FIG. 4a, respectively). The area of the aperture field 21 is denoted as a square; for the sake of simplicity, the apertures are not displayed in FIG. 17. Individual electric potentials are applied to the respective electrodes 170, 171 by means of pins 172 that can be used for electrical contacting of the EZP. Starting from each of the pins 172, a strip conductor 173 feeds the respective electrode. The strip conductors 173 are symbolically displayed in FIG. 17; they are realized beneath the surface of the EZP device 17, thus running below the electrodes 170,171, and integrated in a CMOS layer formed on the SOI wafer.

Figure 18:
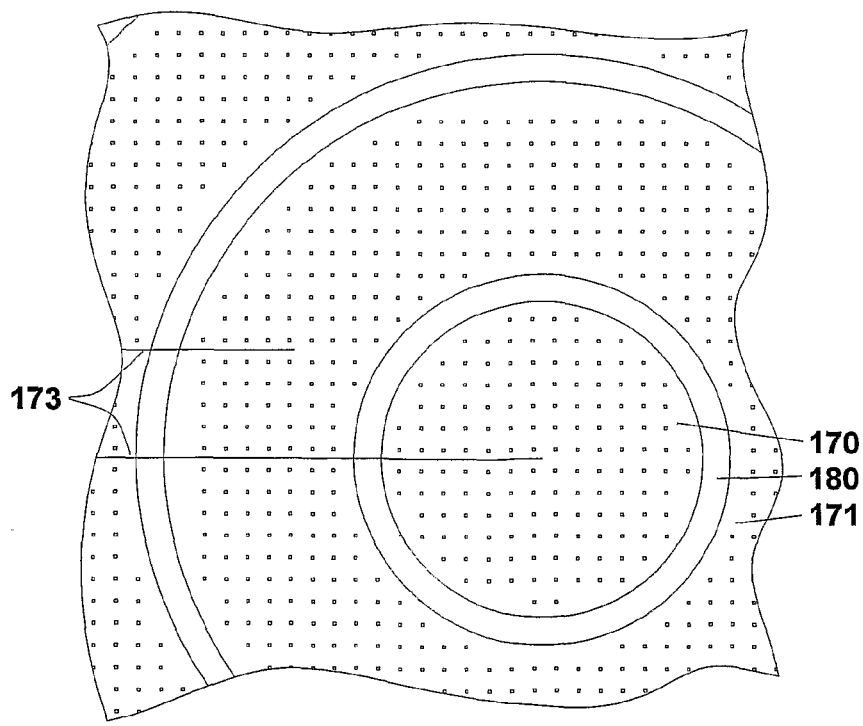
FIG. 18 shows an enlarged detail within the aperture area of FIG. 17.

FIG. 17 shows a plan view of an EZP device 17 with circular electrode arrangement, produced on a SOI wafer;

FIG. 18 shows an enlarged detail of the aperture area of FIG. 17. As can be seen, in this example the apertures (shown as small squares) are only present within the areas covered by the partial electrodes 170,171, whereas at the edges of the electrodes and in the regions of the gaps 180 between the electrodes, no apertures are realized. Also in FIG. 18, some of the strip conductors 173 are symbolically displayed.

Figure 19:
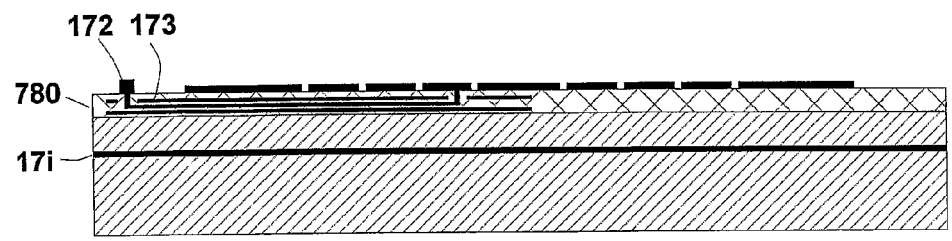
FIG. 19 is a longitudinal section of the EZP device of FIG. 17.
Figure 20:
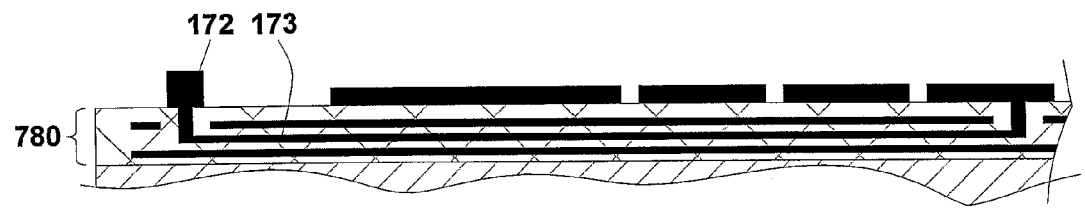
FIG. 20 is an enlarged detail of FIG. 19.

FIG. 19 is a longitudinal section of the EZP device of FIG. 17 along the strip conductor 173 supplying the one innermost circular partial electrode. The strip conductor 173 is provided integrated within the CMOS layer 780 of the SOI wafer (the isolator layer 17i, e.g. $SiO_2$, is marked as a black line). As can bee seen from FIG. 20, which is an enlarged detail of FIG. 19, screening conductors 783 are provided above and below the strip conductor 173, so at least three conductor planes are present within the CMOS layer 780.

Figure 21:
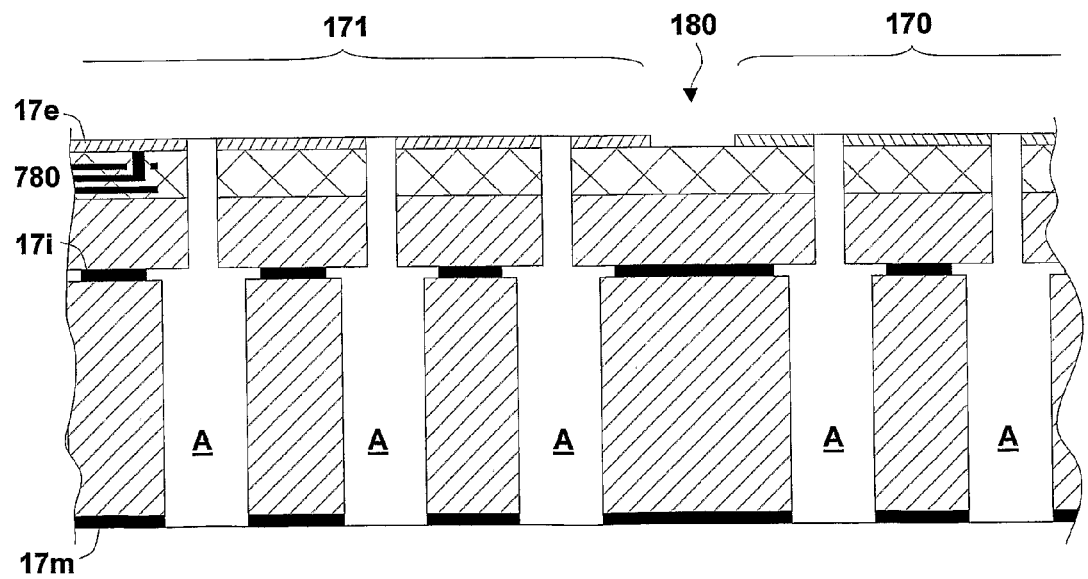
FIG. 21 displays a further enlarged sectional view along a few apertures of the EZP device of FIG. 17.

FIG. 21 presents a further enlarged sectional view along a few apertures of the EZP device 17. On the leftmost part, a strip conductor feeding as discussed above is shown. The particle beam is irradiated from above, traversing the apertures A substantially from top to bottom of the drawing. Only in the regions of the annular electrodes 171,170 apertures are present; at the edges and in the gaps 180 between the electrodes, no apertures are formed. Also shown in FIG. 21 are the SOI insulator layer 17i and a bottom metal layer 17m providing a reference ground potential (0 V). The apertures are wider in the region below the SOI layer 17i in order to decrease the effect arising from mirror charges.

In one special embodiment, the width of the apertures may be 5-10 μm (square side) in the electrode layer 17e, and about 12-25 μm (e.g. square or circular cross section) below the SOI layer 17i. The insulator layer may be undercut, so the width of an aperture at the position of the layer may be 15-28 μm. The thicknesses of the layers may be: Electrode layer 17e=1-5 μm; CMOS layer 780=5-12 μm; upper silicon bulk (between CMOS and insulator layers)=3-20 μm; insulator layer=0.2-2.5 μm; lower silicon bulk (below insulator layer)=20-80 μm; and bottom metal layer=1-5 μm.

Figure 22:
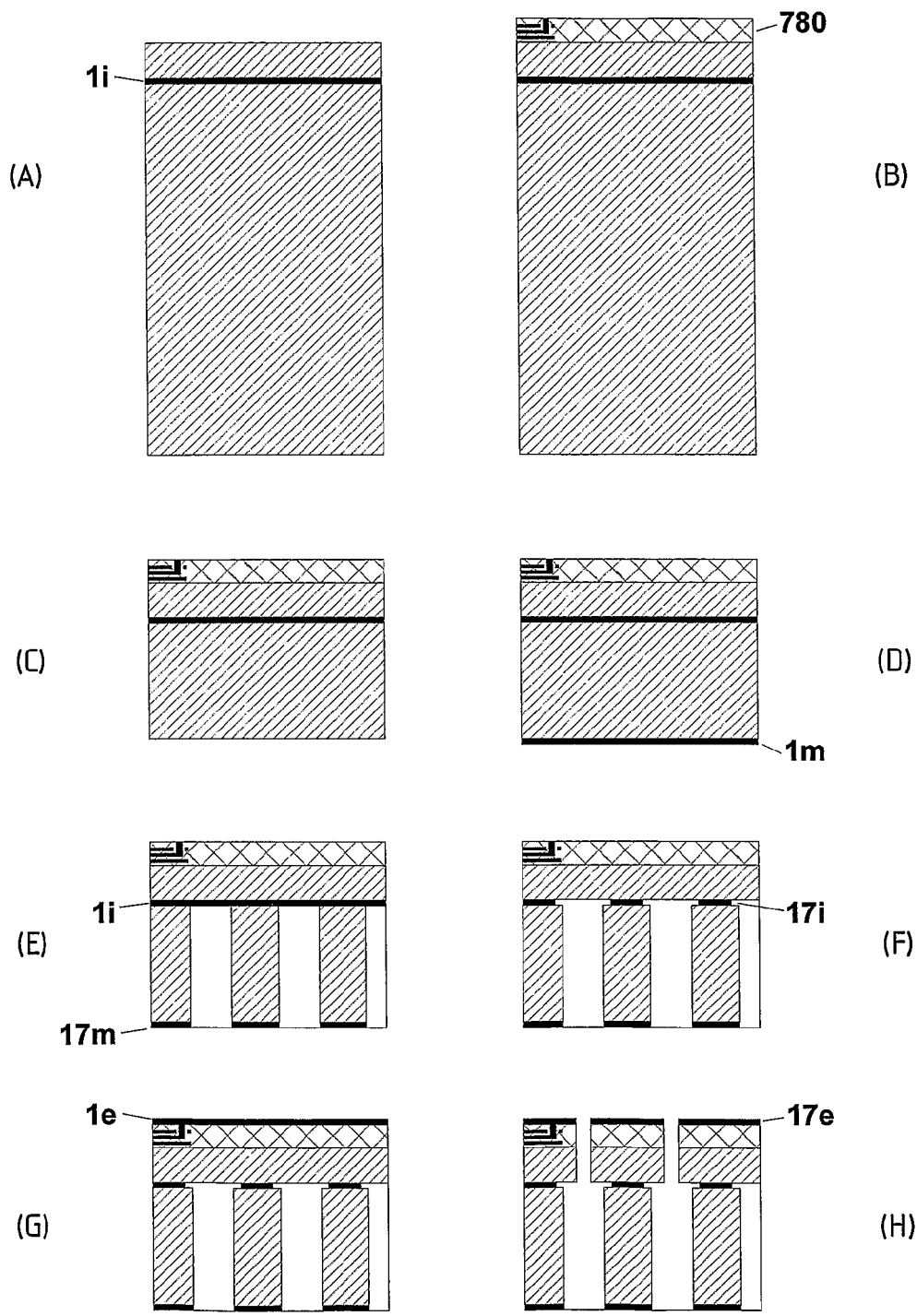
FIG. 22 illustrates a production process for the EZP of FIGS. 17 and 21.

One possible sequence of a production process for an EZP is given below with reference to FIG. 22. The process starts from a <100> SOI wafer (A) with a buried insulator layer 1i (e.g., 0.2 to 2.5 μm $SiO_2$) of a total starting thickness of e.g. 300 to 600 μm, the insulator layer being at an initial position of about 3 to 20 μm below the front side of the SOI wafer. By means of a CMOS processing as well known in the art, a CMOS layer 780 as described above is formed on top of the wafer—step (B). The backside of the wafer is thinned, so the thickness of the bottom silicon layer of the resulting wafer (C) has about 20 to 80 μm. If desired, a resist patterning process on the backside can then be done for a lift-off of the subsequent metal layer 1m. This metal layer 1m is then produced by a suitable process such as an evaporation method like vapor deposition, sputtering or electroplating—step (D). The resist layer (if present) is then removed. Then, the apertures are formed into the lower silicon (including metal layer unless the apertures in the metal layer are formed using a lift-off procedure) by means of a suitable process, e.g. reactive ion etching (RIE) up to the insulator layer 1i. Thus the metal layer 17m obtains its final structuring as well. The apertures of the resulting structure (E) are shaped preferably such that the aperture walls run parallel or expand towards the insulating layer (resulting in a wider cross section of the apertures within the wafer as compared to the bottom surface). In a subsequent step the $SiO_2$ layer 1i is etched by RIE (for example, an $CHF_3$+oxygen plasma) to produce an under cut layer 17i (F). If desired, a resist patterning process on the front face may then be done. A metal layer 1e, e.g. made of gold or titanium, is then produced by a suitable process such as an evaporation method like vapor deposition, sputtering or electroplating—step (G). The resist layer (if present) is then removed. This metal layer is then structured into the partial electrodes 17e by liftoff of the resist; as an alternative to lift-off, structuring of the metal layer may be done by an RIE step. Then, the apertures are etched on the front side through the CMOS layer 780 and the 3-20 μm thick front silicon layer. This is done by means of a suitable anisotropic etching process such as RIE, which produces apertures running parallel, or only minimally wider at the opening into the insulator layer. The width of the apertures in the EZP device (H) thus produced may be, for instance, 5×5 $\mu m^2$ or 10×10 $\mu m^2$.

Although the invention is illustrated and described herein with reference to specific embodiments, the invention is not intended to be limited to the details shown. Rather, various modifications may be made in the details within the scope and range of equivalents of the claims and without departing from the invention.

We claim:

1. A particle-beam projection processing apparatus for irradiating a target by means of a beam of energetic electrically charged particles, comprising:
   an illumination system for generating and forming said energetic particles into an illuminating beam which is substantially tele/homocentric and sufficiently wide,
   a pattern definition system located after the illumination system as seen along the direction of the beam, said pattern definition system being adapted to position an aperture arrangement composed of apertures transparent to the energetic particles in the path of the illuminating beam, thus forming a patterned beam emerging from the aperture arrangement,
   a projection system positioned after the pattern definition system and adapted to project the patterned beam onto a target to be positioned after the projection system, and
   at least one plate electrode means, each of said at least one plate electrode means i) having openings corresponding to the apertures of the pattern definition system and ii) comprising a composite electrode composed of a plurality of partial electrodes, said plurality of partial electrodes being formed in a single layer and co-located on a surface area of said plate electrode means and arranged adjoining each other according to a partitioning of the surface area of the plate electrode means into non-overlapping sub-areas, the plurality of partial electrodes being adapted to be applied different electrostatic potentials, the composite electrode as a whole having lateral dimensions covering the area permeated by the beam portion that images the aperture arrangement in the pattern definition system.

2. The apparatus of claim 1, wherein at least one or all of said plate electrode means are comprised in the pattern definition system, and the composite electrode as a whole has lateral dimensions covering the area reserved for the aperture arrangement in the pattern definition system.

3. A pattern definition device for a particle-beam projection processing apparatus comprising an aperture arrangement composed of apertures transparent to energetic particles,
   comprising at least one plate electrode means, each of said at least one plate electrode means i) having openings for the apertures of the pattern definition device and ii) comprising a composite electrode composed of a plurality of partial electrodes, said plurality of partial electrodes being formed in a single layer and co-located on a surface area of said plate electrode means and arranged adjoining each other according to a partitioning of the surface area of the plate electrode means into non-overlapping sub-areas, the plurality of partial electrodes being adapted to be applied different electrostatic potentials, the composite electrode as a whole having lateral dimensions covering the area reserved for the aperture arrangement in the pattern definition device.

4. A plate electrode means for a particle-beam projection processing apparatus with a pattern definition device having an aperture arrangement composed of apertures transparent to energetic particles of an illuminating beam,
   said plate electrode means having openings corresponding to the apertures of the aperture pattern arrangement and comprising a composite electrode composed of a plurality of partial electrodes, said plurality of partial electrodes being formed in a single layer and co-located on a surface area of said plate electrode means and being arranged adjoining one another according to a partitioning of the surface area of the plate electrode means into non-overlapping sub-areas, the plurality of partial electrodes being adapted to be applied different electrostatic potentials, the composite electrode as a whole having lateral dimensions covering the area permeated by the beam portion that images the aperture arrangement.

5. The plate electrode means of claim 4, adapted to be positioned in an electrode arrangement having at least one additional electrode, in particular an annular electrode, said electrode being positioned out of plane of the composite electrode, as seen along the optical axis.

6. The plate electrode means of claim 5, wherein the at least one additional electrode comprises at least one multipole electrode, the at least one multi-pole electrode positioned out of plane of the composite electrode, as seen along the optical axis.

7. The plate electrode means of claim 4, adapted to be positioned immediately in front of or after the remaining components of the pattern definition device, as seen along the direction of the beam.

8. The plate electrode means of claim 4, adapted to be used in a particle-beam apparatus having a projection system which comprises at least two consecutive projector stages, namely at least one non-final projector stage and one final projector stage, where the plate electrode means is located at or close to the location of an intermediate image of the aperture pattern as formed by a non-final stage of the projection system.

9. The plate electrode means of claim 4, wherein the partial electrodes are positioned along a two-dimensional plane oriented orthogonal to the optical axis.

10. The plate electrode means of claim 4, wherein the partial electrodes are shaped as concentric rings.

11. The plate electrode means of claim 4, wherein the partial electrodes are shaped as sectors arranged around an optical axis of the plate electrode means.

12. The plate electrode means of claim 4, wherein the sector-shaped partial electrodes are arranged around a central area of the plate electrode means, said central area being formed by at least one further partial electrode.

13. The plate electrode means of claim 4, comprising a common electrode arranged in parallel beneath the partial electrodes, the common electrode being separated from the partial electrodes by an insulating spacer layer.

14. The plate electrode means of claim 4, comprising an insulating, dielectric material provided in the gap between neighboring partial electrodes.

15. The plate electrode means of claim 4, comprising a resistive material provided in the gap between neighboring partial electrodes.

16. The plate electrode means of claim 4, wherein openings corresponding to the apertures of the pattern definition system are present only within the areas of each of the partial electrodes.

17. The plate electrode means of claim 4, adapted to be positioned after the pattern definition device (or as its last element) to correct for image distortions by forming an electrostatic lens in combination with an annular electrostatic lens element of the projection system, in order to shift the virtual image by deflection in an out-of-focus plane.

18. The plate electrode means of claim 4, wherein the partial electrodes are made of an electrically conductive material.

19. The plate electrode means of claim 5, adapted to be positioned in place of or after the location of an intermediate image formed in the projection system, to correct for image distortions by locally shifting the virtual image of the intermediate image by deflection in an out-of-focus plane.

20. The plate electrode means of claim 4, adapted to be positioned in place of or after the location of an intermediate image formed in the projection system, to produce a negative focal length at the position or near the intermediate image by forming an electrostatic lens in combination with an annular electrostatic lens element of the projection system on either or both sides of the plate electrode means.

* * * * *